United States Patent [19]
Brady

[11] Patent Number: 6,018,484
[45] Date of Patent: Jan. 25, 2000

[54] METHOD AND APPARATUS FOR TESTING RANDOM ACCESS MEMORY DEVICES

[75] Inventor: James Brady, Plano, Tex.

[73] Assignee: STMicroelectronics, Inc., Carrollton, Tex.

[21] Appl. No.: 09/183,591

[22] Filed: Oct. 30, 1998

[51] Int. Cl.[7] .................................................. G11C 7/00
[52] U.S. Cl. .......................................... 365/201; 365/200
[58] Field of Search ..................................... 365/201, 208, 365/200, 189.01; 371/21.1

[56] References Cited

U.S. PATENT DOCUMENTS

| | | | |
|---|---|---|---|
| 4,868,823 | 9/1989 | White, Jr. et al. | 365/201 |
| 5,305,261 | 4/1994 | Furutani et al. | 365/200 |
| 5,455,798 | 10/1995 | McClure | 365/200 |

*Primary Examiner*—David Nelms
*Assistant Examiner*—Anh Phung
*Attorney, Agent, or Firm*—Theodore E. Galanthay; Lisa K. Jorgenson; Andre Szuwalski

[57] ABSTRACT

A method and apparatus for testing a random access memory device, such as a dynamic random access memory device embedded within an integrated circuit chip. The apparatus includes one or more rows of transistors, each of which is connected to a bit line pair of the memory device and to a data line. Data is placed onto the bit lines by driving the data line to a predetermined voltage level and turning on the transistors in the transistor row. Data placed on the bit lines forms a test pattern that may be subsequently written into any row of memory cells. By directly controlling the bit lines of the memory device in this way, test patterns may be quickly and easily stored in the memory device for functional verification thereof.

9 Claims, 6 Drawing Sheets

METHOD AND APPARATUS FOR TESTING RANDOM ACCESS MEMORY DEVICES

BACKGROUND OF THE INVENTION

1. Technical Field of the Invention

The present invention relates to a method and device for testing random access memory, and particularly to a method and device for testing dynamic random access memory (DRAM) devices.

2. Background of the Invention

There are two known types of semiconductor memory, one referred as volatile memory and the other referred to as non-volatile memory. In volatile memories the stored data is lost when the power supply is removed from the semiconductor device. A non-volatile memory, on the other hand, retains the data stored for extended periods after the power supply to the device has been removed. In a computer or related systems, non-volatile memory is used for long-term storage of programs and data which seldom or never changes, and volatile memory devices are used for the short-term storage of program instructions and data during the execution of a program.

Volatile memory devices may be divided into two categories. Static Random Access Memory (SRAM) consists of flip-flop latches such that each SRAM latch maintains a bit of data so long as power is provided to the SRAM. In dynamic memories, including DRAM devices, a charge representing a data bit is stored on a capacitor. A bit of data is maintained in a DRAM cell in part by periodically refreshing the cell with data previously stored therein, as explained below.

Conventional DRAM cells employ a single transistor architecture wherein the memory cell comprises a storage capacitor having a first terminal connected to a reference voltage, such as Vss, and a second terminal connected to a pass and/or transmission gate transistor. The pass gate transistor serves to transport charge to the storage capacitor, and also to read the charged or uncharged state of the storage capacitor. The gate electrode of the pass/transmission gate transistor is tied to a word line decode signal and the drain electrode thereof is connected to a bit line. Data is stored in the memory cell as a charge on the storage capacitor. However, because data is stored in a dynamic memory cell as a charge on a capacitor and because memory cells experience leakage current either from the storage capacitor or the pass gate transistor, the stored charge in a dynamic memory cell, particularly a stored charge representing a high logic level, decays over time. Each bit of data stored in a DRAM device must therefore be periodically refreshed before it has irretrievably decayed.

The core of a DRAM is typically partitioned into arrays or blocks of memory cells, with each array including a plurality of rows of memory cells and with the cells in each row being connected to a respective one of a plurality of word lines. Memory cells in each column of cells in an array are connected to a respective one of a plurality of bit lines. Bit lines are grouped in pairs such that when data from a memory cell is read onto a first bit line of a bit line pair, the second bit line of the bit line pair is provided with a voltage level that is representative of a signal between a low logic level and a high logic level, relative to the amount of charge that can be placed thereon by a charge stored in a memory cell. This difference in voltage levels between the bit lines of the bit line pair is the differential to which an associated sense amplifier operatively responds.

Sense amplifiers are typically connected to the bit lines of dynamic memory to sense the small change in potential appearing on the bit lines following a memory cell read operation and to drive the bit lines to the appropriate full reference voltage level, such as Vdd or Vss. Once the sense amplifier drives the bit line to the full reference voltage level, the memory cell from which data was read is refreshed with the full reference voltage signal appearing on the bit line.

It is customary to test both the functionality and timing of integrated circuits in order to ensure that the final product performs as specified. With respect to dynamic memory, it is customary to write test patterns into the memory array to test the ability of dynamic memory cells to maintain a stored charge. Such testing screens dynamic memory devices having storage capacitors which sufficiently maintain a stored charge from those dynamic memory devices having "weak" cells which fail to sufficiently maintain a stored charge. For example, storing a charge in a memory cell representing a high logic level and later retrieving the stored charge will test the extent of leakage current associated with the particular memory cell and distinguish dynamic memory devices which perform as specified from those dynamic memory devices possessing an excessive level of leakage current. In order to test the ability of a dynamic memory cell having stored therein a logic high level to maintain its charge, it is commonplace to write a logic high value into a memory cell while writing a logic low value into its surrounding cells.

On-chip test circuitry such as Built In Self Test (BIST) circuitry provides for an increase in the controllability and observability of nodes (segments interconnecting distinct electrical components) within an on-chip memory device so as to increase the ability to access and hence test the memory device. The use of BIST techniques is particularly necessary for testing memory devices which are embedded within an integrated circuit chip. In situations where more than one embedded memory device is located on an integrated circuit chip, additional on-chip test circuitry has been previously employed in association with the embedded memory devices so that the BIST circuitry would not have to be tailored to the individual embedded memory devices. For instance, a pair of read only memory (ROM) cells storing a low logic level and a high logic level have been selectively connected to the bit line pairs of dynamic memory devices so as to increase the controllability of the bit lines, thereby simplifying the writing of test data patterns into the memory arrays and expanding the ability to apply various test patterns to the memory devices. The ROM cell pair has comprised a first transistor hardwired to the low reference voltage level and a second transistor hardwired to the high reference voltage level.

The aforementioned connection of ROM cells to each bit line of a memory device, however, occupies an appreciable amount of space on the integrated circuit. Accordingly, there exists a need to efficiently access memory devices embedded within an integrated circuit chip for purposes of better testing the embedded memory device, taking into consideration size constraints, node accessibility, chiplevel pin limitations, and test vector programmability for the embedded memory device.

SUMMARY OF THE INVENTION

Embodiment of the present invention overcome the shortcomings of prior methods and apparatuses for testing memory devices and satisfies a significant need for an effective technique for testing random access memory (RAM). The present exemplary testing method is applicable for stand-alone, off-the-shelf memory chips but is especially suited for one or more memory devices embedded within an integrated circuit, such as a microprocessor chip or an application specific integrated circuit (ASIC). A dynamic memory device and corresponding test circuitry embedded within an ASIC may, for example, advantageously utilize additional metal interconnect layers to perform test-related functions not commonly available in stand-alone, off-the-shelf dynamic memories while occupying relatively little additional silicon space on the integrated circuit chip.

According to embodiments of the present invention, there is provided an array of one or more rows of field-effect transistors, with each transistor being operatively associated with a selected bit line pair of the dynamic memory. A single control line is connected to the gate electrode of each transistor in a row of transistors, and different control lines are connected to the gate electrodes of transistors in different rows of transistors. The source electrode of each transistor is connected to a bit line of the memory device such that a bit line is connected to no more than one transistor. A single data line is connected to the drain electrode of each transistor in a row of transistors, and different data lines are connected to the drain electrodes of transistors in different rows of transistors. The data and control lines are driven by chip-level test signals and/or test circuitry associated with the particular memory device. A test vector or pattern is quickly placed on the bit lines for subsequent writing into a row of memory cells following the control lines being driven to the appropriate reference voltage level to turn on the transistors in the transistor row.

The present invention may preferably further include a device for quickly testing the ability of an entire row of memory cells to maintain a test pattern of data. This test device comprises a plurality of rows of field-effect transistors, a precharge circuit and a sensing circuit. The gate electrode of the transistors in a row of transistors is tied to a compare enable line. The drain electrode of each transistor in a transistor row is connected to a bit line of a bit line pair. The source electrode of each transistor in the transistor row is connected to a compare data line, to which is connected a sensing circuit and a precharge circuit. In a test operation, a test vector is retrieved from a row of memory cells. If every bit value matches the expected value placed on the compare data line by the precharge circuit, the sensing circuit indicates a favorable comparison.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE PREFERRED EMBODIMENTS

Figure 1:
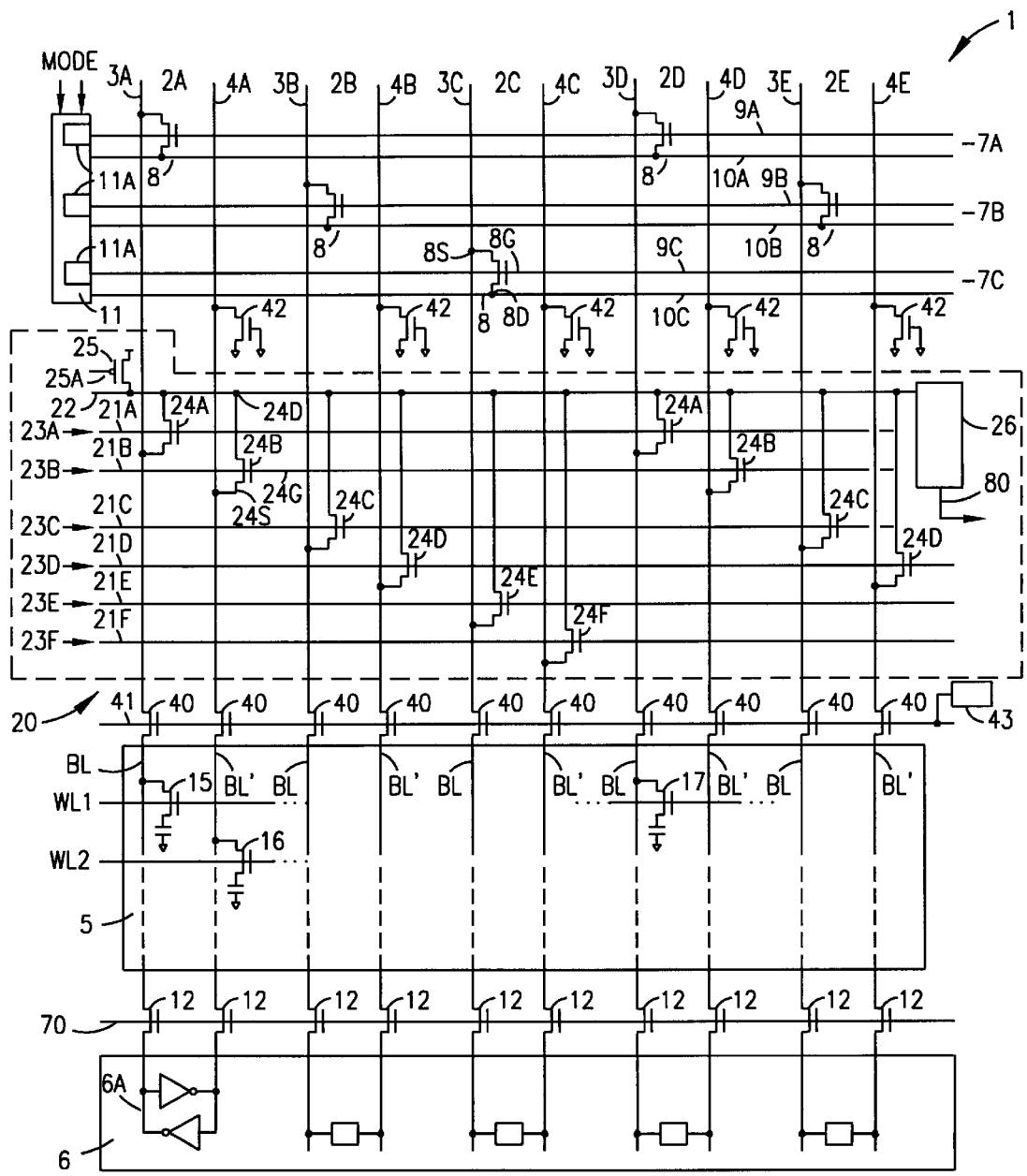
FIG. 1 is a circuit diagram illustrating a preferred embodiment of the present invention.

Referring to FIG. 1, there is shown a bit line control device 1 for a memory device, such as a dynamic memory device. The dynamic memory device includes a number of bit line pairs 2, with each pair of bit lines including bit lines BL 3 and BL' 4. Individual bit line pairs 2 are identified as bit line pairs 2A–2E and individual bit lines are identified as bit lines BL 3A–3E and BL' 4A–4E. Although five bit line pairs are illustrated in FIG. 1, it is understood that the present invention may be employed as part of or in conjunction with memory devices having virtually any number of bit lines.

As shown in FIG. 1, bit line pairs 2 extend upwardly from memory array 5 and downwardly therefrom for connection to sense amplifiers 6 via transmission gates 12. For reasons of clarity, bit line control device 1 is shown disposed along a side of memory array 5 that is substantially opposite the side of memory array 5 along which the sense amplifiers 6 are disposed. In this configuration, the present invention preferably includes a row of isolation transmission gates 40, which are activated by test isolate signal 41 to electrically connect bit line control device 1 and memory array 5, and isolate the capacitive contribution of bit line control device 1 when not in use. It is understood that bit line control device 1 may be disposed between memory array 5 and sense amplifiers 6, and specifically between transmission gates 12 and memory array 5.

Bit line control device 1 preferably includes a plurality of groups or rows 7A–7C of transistors 8. Transistors 8 preferably comprise n-channel field-effect transistors, but alternatively transistors 8 may comprise other devices, such as p-channel field-effect transistors or bipolar transistors. Each transistor 8 in rows 7A–7C is connected to a different bit line pair 2A–2E so that each bit line pair 2A–2E is associated with a single transistor 8. Transistors 8 act as transmission gates in selectively providing test patterns to bit line pairs 2A–2E from various data lines.

Specifically, the gate electrode 8G of each transistor 8 in a transistor row 7 is connected to a control line 9. The source electrode 8S of each transistor 8 is connected to a bit line 3 or 4 of a bit line pair 2. The drain electrode 8D of each transistor 8 is connected to a data line 10. In this way, driving control lines 9A–9C and transistor gate electrodes 8G towards a high reference voltage turns transistors 8 on, which allows bit lines 3 or 4 connected to transistors 8 to be driven to the same voltage level to which data lines 10–10C are driven.

The present invention may be utilized to place on each bit line 3 or 4 data representing either a logic high or a logic low, for subsequent writing into a row of memory cells 15 or 16 within memory array 5. Because a data line 10 may be driven to any voltage level between and including the low reference voltage level and the high reference voltage level, at most one transistor 8 needs to be connected to any one bit line 3 or 4. Further, by utilizing sense amplifiers 6, which sense a voltage differential appearing on each bit line pair 2 and drive each of the bit lines 3 and 4 to opposite reference voltage levels, the present invention only requires a single transistor 8 being connected to one of the bit lines of a bit line pair 2 in order to be capable of driving each bit line in memory array 5 to the desired level. This may be accomplished by driving one bit line 3 or 4 of a bit line pair 2 to a desired voltage level and allowing the sense amplifier 6 associated with the bit line pair 2 to drive the bit lines 3 and 4 to the appropriate reference voltage levels based thereupon. In order to balance the capacitances between bit lines 3 and 4 of a bit line pair 2, the bit line 3 or 4 that is not connected to a transistor 8 is preferably connected to a dummy transistor 42. Each transistor 42 is preferably the same size as its corresponding transistor 8 to closely balance the capacitances between the bit lines of bit line pairs 2. Transistors 42 are preferably turned off by hardwiring their gate electrodes to an appropriate reference voltage level.

Transistors 8 are preferably arranged in rows so as to conserve silicon space in connecting to control lines 9A–9C and data lines 10–10C. Transistors 8 may be arranged or grouped into patterns other than rows to accommodate the layout of memory array 5 and/or connections to control lines 9 and data lines 10.

Figure 2:
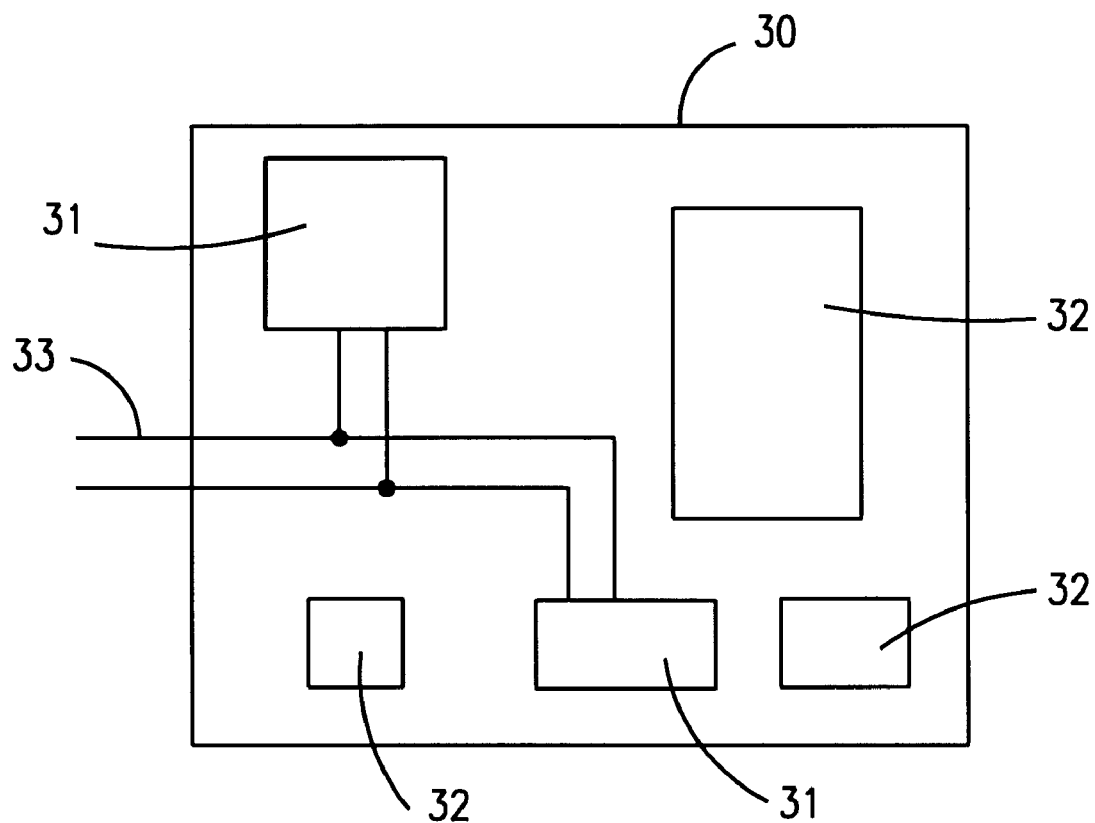
FIG. 2 is an illustration of an integrated circuit chip having embedded memory devices disposed thereon.

Control lines 9A–9C and data lines 10–10C are preferably routed substantially the entire length of memory array 5 in order to connect to each bit line pair 2. Control lines 9A–9C may be driven by test control circuitry 11, such as BIST circuitry, which is used to configure the memory device into a test mode. In order to simplify the ability to configure the memory device in a test mode and directly control bit line pairs 2, test circuitry 11 may be located on-chip and have as its input chip-level input signals. Because only a relatively small number of chip-level input test signals are needed to control test circuitry 11, control lines 9 and data lines 10 for each memory device embedded on an integrated circuit chip, chip-level pin usage is minimized. FIG. 2 illustrates in general terms an exemplary layout of an integrated circuit chip 30 having embedded memory devices 31 and other logic 32 disposed thereon, with chip-level test signals 33 being routed to and controlling both embedded memory devices 31. As a result, access to bit line pairs 2 is easily provided, thereby increasing the ability to quickly and efficiently write test patterns into memory array 5.

Bit line control device 1 may employ virtually any number of transistor rows 7. The number of transistor rows 7 employed depends in part upon the available silicon area on the integrated circuit chip and the desire to write various test vector patterns into memory array 5 in order to suitably test memory array 5. For example, employing one transistor row 7 in which all transistors 8 are tied to a common control line 9 and data line 10 limits the control over bit line pairs 2 to writing row test patterns having all high logic level data or low logic level data. Similarly, employing two transistor rows 7 in which each transistor row 7 is tied to a different data line 10 allows for up to four different test patterns that can be written into memory array 5. As can be seen, the number of different test vector patterns which can be written by the present invention onto bit line pairs is $2^n$, where n is the number of transistor rows 7.

It is understood that certain test vector patterns are more useful in characterizing and/or testing memory array 5, and that transistors 8 may be assigned to particular control lines 9 in order to produce the desired test vector pattern(s) without having to employ a relatively large number of transistor rows 7. For example, writing row test patterns of all logic low data, all logic high data and alternating logic low data and logic high data ('010101') may be accomplished by arranging transistors 8 connected to adjacent bit line pairs 2 so that their gate electrodes 8G are connected to distinct control lines 9 (connecting transistors 8 connected to bit line 3A, 3C and 3E to data line 10A and transistors 8 connected to bit lines 3B and 3D to data line 10B).

It is understood that control lines 9A–9C and test isolate signal 41 may be each driven to a voltage level in excess of the high reference voltage level in order to place a full high reference voltage level on bit lines 3A–3E. For example, test control circuitry 11 may include bootstrap circuits 11A for driving control lines 9A–9C to a voltage level in excess of the high reference voltage level, and the present invention may include bootstrap circuit 43 to drive test isolate signal 41 in a similar manner.

Figure 3:
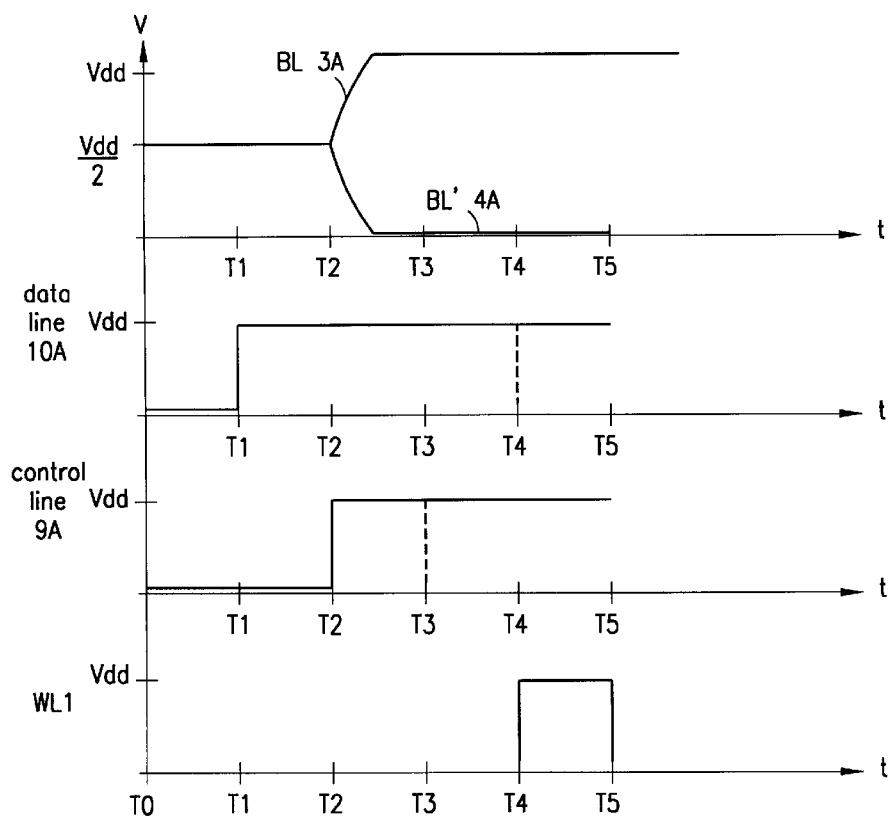
FIG. 3 is a timing diagram illustrating the execution of a write operation utilizing the present invention.

FIG. 3 is a timing diagram illustrating a write operation for storing data into a single memory cell 15 associated with a bit line pair 2, according to the present invention. Consider the case wherein data representing a high logic level is to be written into memory cell 15 connected to bit line BL 3A. At time T0 bit lines BL 3 and BL' 4 of bit line pair 2 are precharged and equalized to an intermediate voltage, such as Vdd/2. At time T1, data line 10A is driven to the high reference voltage level (Vdd). At time T2, control line 9A is driven to the high reference voltage level which turns on the transistor 8 associated with bit line BL 3A so that bit line BL 3A is pulled towards the high reference voltage level. Because transmission gates 12 are turned on (via isolate signal 70 being driven to a high reference voltage level) so as to electrically connect sense amplifiers 6 to bit lines 3 and 4, sense amplifier 6A associated with bit line pair 2A senses a voltage differential between bit line BL 3A and bit line BL' 4A and thereafter drives bit line BL 3A towards the high reference voltage level (Vdd) and bit line BL' 4A towards the low reference voltage level (Vss). At time T3, the control line 9A may be driven to the low reference voltage level (as shown by the dotted line in FIG. 3), causing transistor 8 connected to bit line BL 3A to turn off. Word line WL1 associated with the row of memory cells to which data is to be written is driven at time T4 to the high reference voltage level, thereby providing the voltage appearing on bit line BL 3A driven by sense amplifier 6 to memory cell 15. At time T5 word line WL1 is driven to the low reference voltage level, thereby shutting off electrical communication between bit line BL 3A and memory cell 15. At this point, memory cell 15 stores data representing a high logic level.

It is understood that the above-described procedure may be employed to write a test pattern into an entire row of memory cells 15 or 16 by substantially simultaneously activating each transistor 8 via suitable manipulation of control lines 9A–9C and data lines 10A–10C.

The operational steps for storing data representing a high logic level onto bit line BL' 4A or storing data representing a low logic level onto bit line BL 3A similarly include the steps of precharging and equalizing bit line BL 3A and BL' 4A at T0 and driving data line 10A at T1 to the low reference voltage level (as opposed to the high reference voltage level depicted in FIG. 3). Driving control line 9A to the high reference voltage level causes bit line BL 3A to be driven towards the low reference voltage level, at which point sense amplifier 6A associated with bit line pair 2A senses the voltage differential between bit line BL 3A and bit line BL' 4A and drives bit line BL' 4A towards the high reference voltage level (as opposed to bit line 3A being driven to the high reference voltage level and bit line 4A being driven towards the low reference voltage level depicted in FIG. 3). When word line WL2 is driven towards the high reference voltage level at time T4, the high reference voltage level appearing on bit line BL' 4A is provided to memory cell 16.

Figure 4:
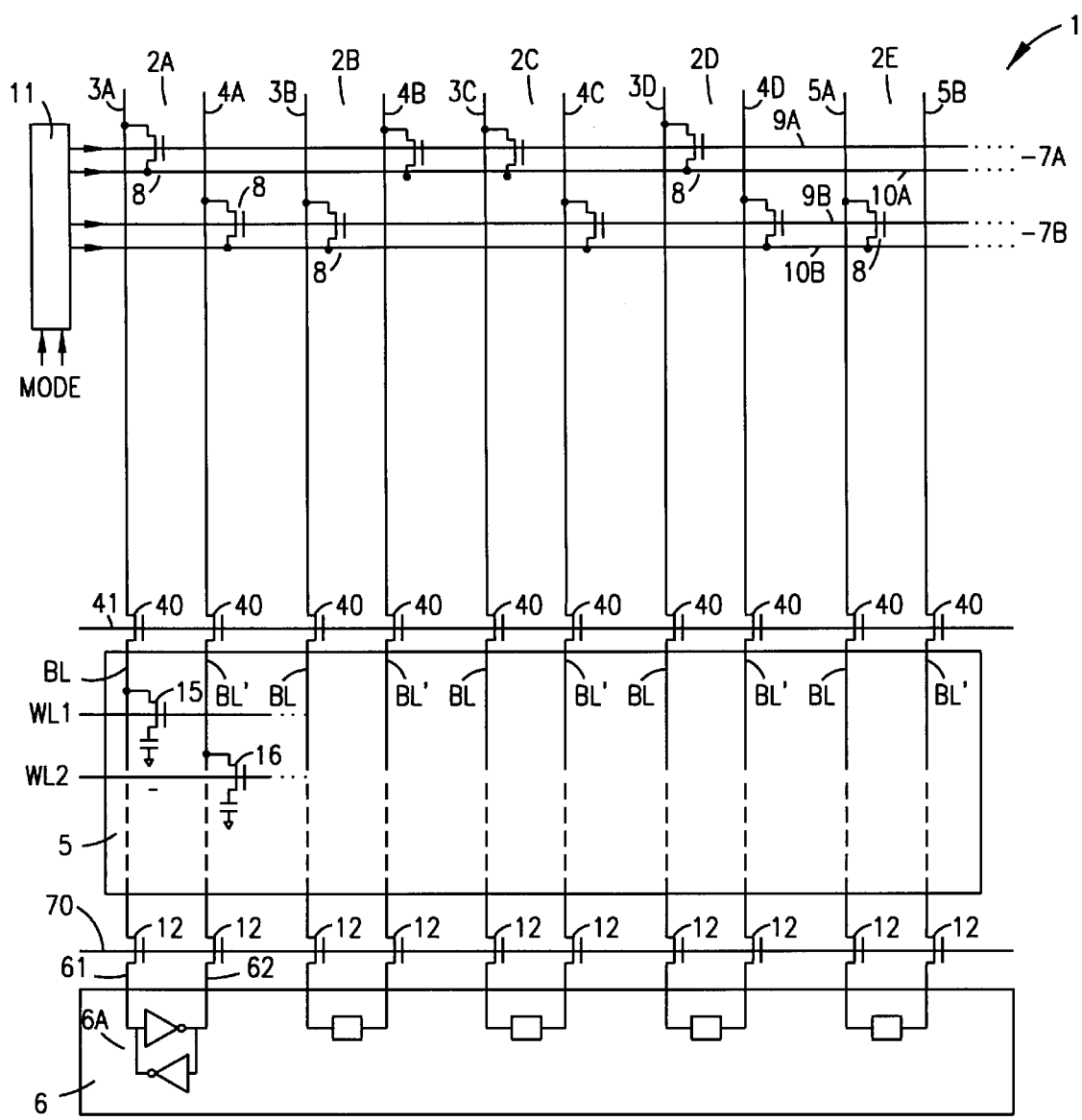
FIG. 4 is a circuit diagram illustrating a second preferred embodiment of the present invention.

Referring to FIG. 4 and in accordance with another preferred embodiment of the present invention, a transistor 8 is connected to each bit line of a bit line pair 2 such that each bit line thereof may be directly driven to the low reference voltage level (Vss), the high reference voltage level (Vdd) or a voltage therebetween. This embodiment does not require sense amplifiers 6 to drive the bit lines of bit line pairs 2A–2E to the appropriate voltage levels. As such, transmission gates 12 may be turned off during the storing of a test pattern (placed on bit lines 2A–2E by bit line control device 1) into a row of memory cells. Because of the isolation of sense amplifiers 6 from bit line pairs 2A–2E and noting that conventional sense amplifiers for dynamic memory comprise cross-coupled inverters equating to a latch, sense amplifiers 6 may hold data previously read from a row of memory cells for later use while bit lines 2A–2E are employed to store a test pattern into a row of memory cells without data in sense amplifiers 6 being overwritten.

For example, data stored in sense amplifiers 6 may be later written into another row of memory cells, driven out of the memory device, etc. A test method according to the present invention may include reading data from a row of memory cells into sense amplifiers 6, and, while the word line for the row of memory cells is still active and after transmission gates 12 isolate sense amplifiers 6 from memory array 5, directly writing test patterns into the same row or another row of memory cells using bit line control device 1. The data stored in sense amplifier 6 then may be written into another storage element, such as an external latch, while the direct writing is performed by bit line control device 1.

Figure 5:
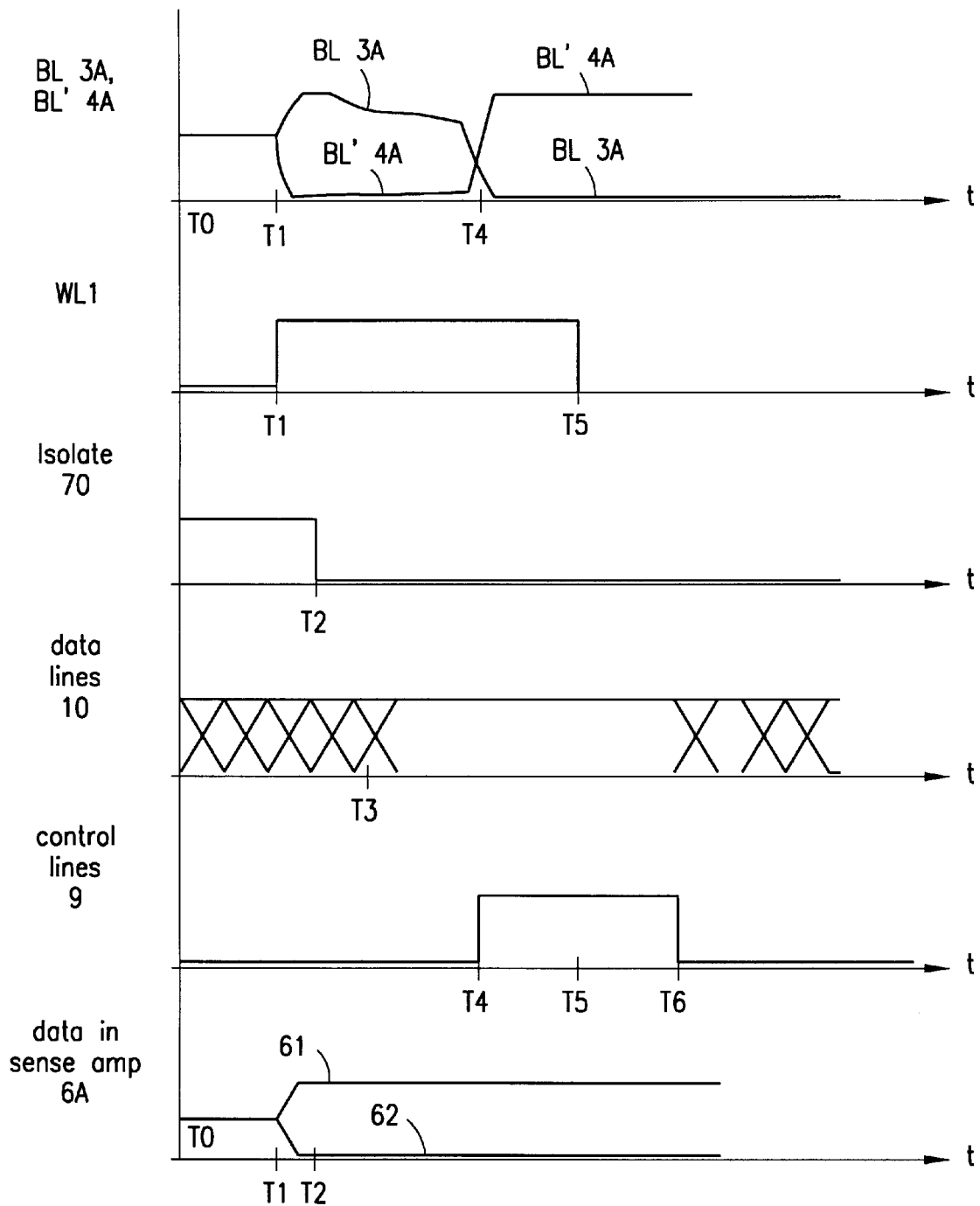
FIG. 5 is a timing diagram illustrating the execution of a read-write operation utilizing the second embodiment of the present invention.

Referring to FIG. 5, there is illustrated a timing diagram for a read-write operation according to the second preferred embodiment of the present invention. At time T0, bit lines 3A and 4A (as well as all other bit lines 3 and 4) are equalized to an intermediate voltage, such as Vdd/2. At time T1, word line WL1 is driven to the high reference voltage level, which connects a row of memory cells to bit lines 3 and 4. A charge representing a high logic level is placed on bit line 3A from storage cell 15, after which sense amplifier 6A drives bit line 3A towards the high reference voltage level and bit line 4A to the low reference voltage level. At time T2, transmission gates 12 are turned off by isolate signal 70 being driven to the low reference voltage level, thereby isolating sense amplifiers 6 from bit lines 3 and 4 and storing data retrieved from the row of memory cells connected to word line WL1 in sense amplifiers 6. At time T2, sense amplifier 6A stores a high logic level on node 61 and a low logic level on node 62. Next, data lines 10 are driven to the desired voltage level at time T3. It is noted that data lines 10 may be driven to the desired voltage levels earlier than time T3. In this example illustrated in FIG. 5, data line 10A is driven to the high reference voltage level and data line 10B is driven to the low reference voltage level. At time T4, control lines 9 are driven to the high reference voltage level, which turns transistors 8 on. At this point, bit line 3A is driven to the low reference voltage level and bit line 3B is driven to the high reference voltage level. With word line WL1 remaining at the high reference voltage level, data stored on bit lines 3 and 4 are provided to memory cells connected to word line WL1. When word line WL1 is driven to the low reference voltage level at time T5, the data appearing on bit lines 3 and 4 are stored in the row of memory cells. Thereafter, control lines 9 are driven low at time T6 to turn off transistors 8. During the entire write operation described above (between time T3 and T6), the data retrieved from the row of memory cells connected to word line WL1 remains stored in sense amplifiers 6 for later use.

The above-described test method may, for example, result in the repetitive operation of reading data from a row of cells, writing data directly therein, incrementing the addressing circuitry to point to the next row of words and repeating the read and write operations as described, until each row of memory array 5 has been quickly and thoroughly tested.

The present invention may further include test circuitry 20 (FIG. 1) for quickly testing the ability of an entire row of memory cells to maintain a test pattern of data. Test circuitry 20 preferably includes compare enable lines 21A–21F, a compare data line 22, six rows 23A–23F of transistors 24A–24F, precharge circuit 25 and sense circuit 26.

Compare enable lines 21A–21F are connected to the gate electrode of those transistors 24 in their respective row of transistors. Compare data line 22 is connected to the drain electrode of each transistor 24 in rows 23A–23F. Each bit line 3A–3E and 4A–4E is connected to the source electrode of a transistor 24. In the embodiment shown in FIG. 1, each row 7A, 7B, and 7C of transistors 8 corresponds to a pair of rows 23A–B, 23C–D and 23E–F, respectively. Because each pair of transistor rows 23A–B, 23C–D, and 23E–F of test circuitry are substantially identical in terms of structure and interconnection with memory array 5 and bit line control device 1, only a pair of such transistor rows will be described in detail.

For the case of transistor rows 23A–23B of test circuitry 20, for every bit line pair 2 that is connected to a transistor 8 in transistor row 7A, each bit line in the bit line pair 2 is also connected to a transistor 24A or 24B of transistor rows 23A and 23B of test circuitry 20. Transistor 24A is connected to bit line 3 and transistor 24B is connected to bit line 4 of such bit line pair 2. As shown in FIG. 1, transistors 24A and 24B are connected to bit line pairs 2A and 2D. This relationship between transistor row 7A of bit line control device 1, transistor rows 23A and 23B of test circuitry 20 and bit line pairs 2A and 2D allows for a test vector written into memory array 5 (using transistor row 7A) to be quickly tested (using transistor rows 23A and 23B). Transistors 24A and 24B are employed to test a high logic level being stored on bit lines 3 and 4, respectively. Precharge circuit 25 is preferably capable of driving compare data line 22 to the high reference voltage level. Accordingly, precharge circuit 25 preferably comprises a p-channel pull-up device 25A having a gate electrode which is selectively driven to Vss. Sensing circuit 26 is connected to compare data line 22 and senses the voltage appearing thereon and generates a signal on output line 80 that is indicative of the sensed voltage level.

Figure 6:
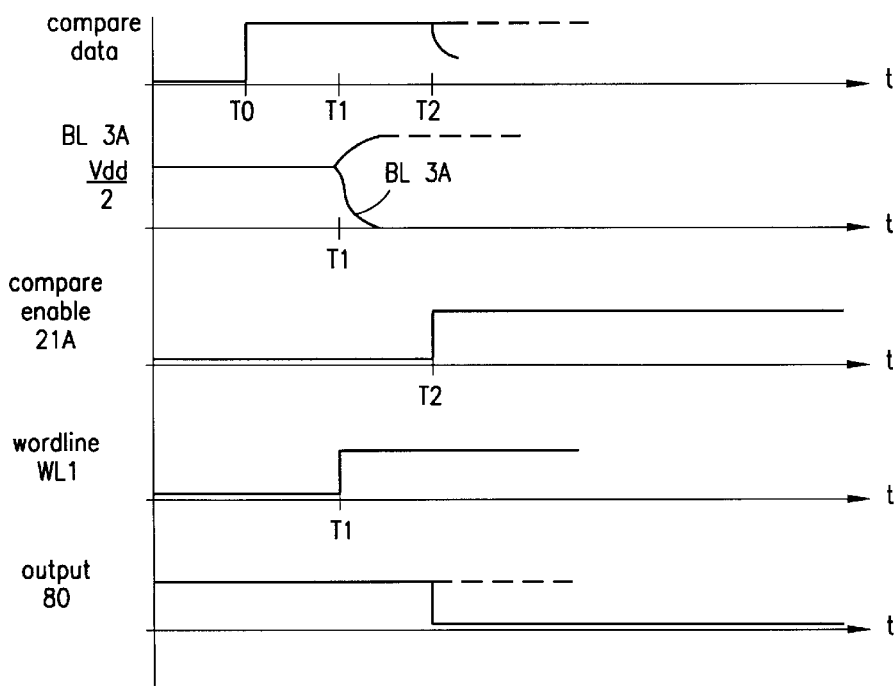
FIG. 6 is a timing diagram illustrating the execution of a compare operation utilizing an embodiment the present invention.

Reference is now made to the timing diagram of FIG. 6. In a test operation, compare data line 22 is precharged at time T0 to a high reference voltage level by precharge circuit 25. Consider transistor row 7A of bit line control device 1 previously storing a logic level high value into memory cells 15 and 17 of memory array 5. This test pattern which was previously written into a row of memory cells is retrieved therefrom at time T1 due to the wordline WL1 associated with the row of memory cells being driven to the high reference voltage level. After sense amplifiers 6 associated with bit line pairs 2 sense the retrieved data and drive the bit lines towards the appropriate reference voltage levels shortly after time T1 (FIG. 6 shows a bit line BL 3A being driven to a low reference voltage, representing a bad data bit being stored in memory cell 15, shortly after time T1), compare enable line 21A (as well as either compare enable line 21C or 21D and 21E or 21F) is driven to the high reference voltage level at time T2 which turns on each transistor 24A in transistor row 23A. In the event the voltage level on any bit line connected to compare data line 22 differs from the precharged voltage level (Vdd in this example) of compare data line 22, the voltage level appearing on compare data line 22 changes from the precharge voltage level, as shown in FIG. 6. In this case, the change in voltage level is sensed by sensing circuit 26 shortly after time T2 and output signal 80 changes state (from a logic high state to a logic low state in this example) to indicate a voltage transition on compare data line 22 and hence a memory storage test error. In the event the voltage level on each bit line 3 from the memory read operation substantially matches the precharged voltage level appearing on compare data line 22 (represented by dashed lines in FIG. 6), no voltage change occurs on compare data line 22 at time T2 and sensing circuit 26 generates a signal indicating no memory storage test error occurring.

As to bit line pair 2A, it is understood that test circuitry 20 may be similarly used to test for a logic low level stored in memory cell 15 by precharging compare data line 22 to Vdd at time T0, driving wordline WL1 to Vdd at time T1, and driving compare enable line 21B (instead of compare enable line 21A) to Vdd at time T2. Test circuitry may also be used to test for a logic high level stored in memory cell 16 by precharging compare data line 22 to Vdd at time T0, driving wordline WL2 (instead of wordline WL1) to Vdd at time T1, and driving compare enable line 21B to Vdd at time T2. Testing for a logic low level stored in memory cell 16 is accomplished by driving wordline WL2 to Vdd at time T1 and driving compare enable line 21A to Vdd at time T2.

As can be seen, by activating the appropriate compare enable lines 21A or 21B, 21C or 21D, and 21E or 21F, any test pattern previously stored into memory array 5 using bit line control device 1 may be tested.

Figure 7:
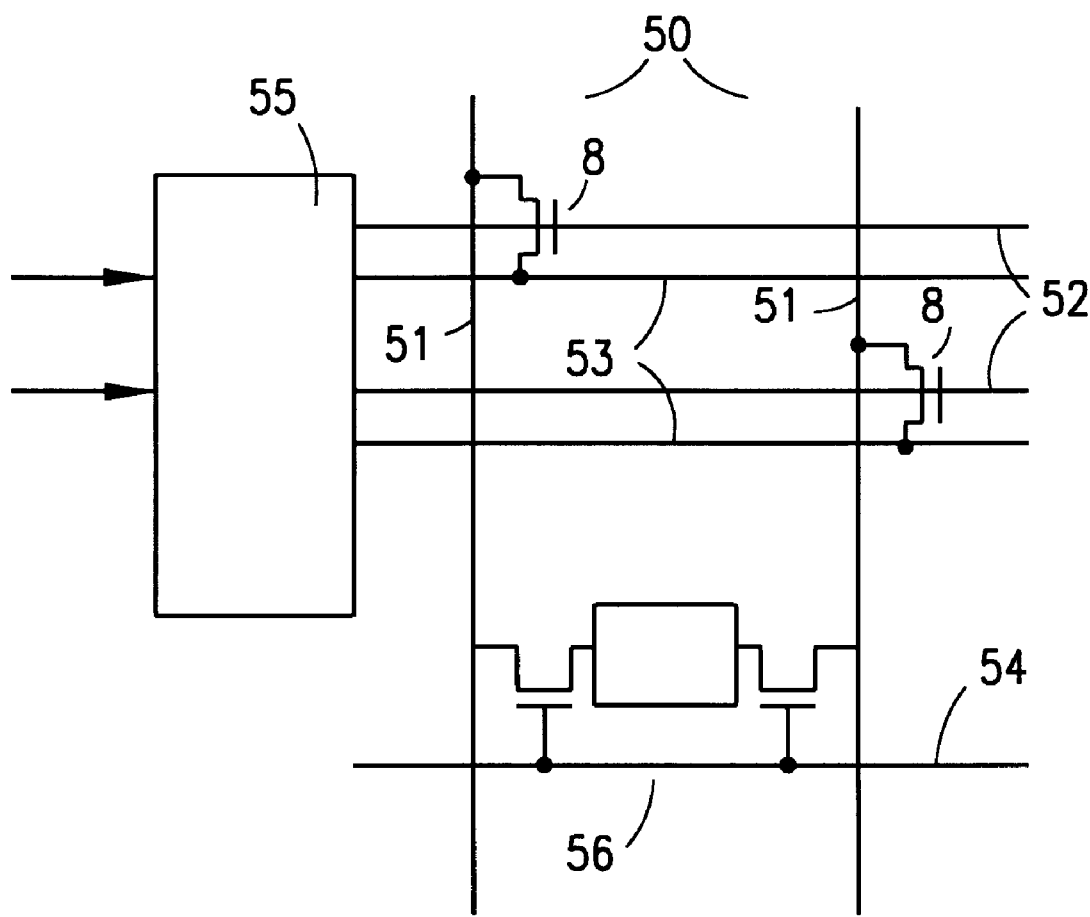
FIG. 7 is a circuit diagram illustrating an exemplary embodiment of the present invention.

It is understood that the present invention may be associated with SRAM devices or other semiconductor memory devices to relatively quickly write test patterns onto bit lines of the SRAM device. In this context, a distinct transistor 8 is connected to each bit line of a bit line pair 50, with each transistor 8 being individually capable of driving its corresponding bit line either to Vss or Vdd, as shown in FIG. 7. A read operation in a test mode, which would suitably test the output drive circuitry (not shown) of the SRAM device, would include equilibrating the bit lines to Vdd of bit line pair 50 and activating one of the transistors 8 associated with bit line pair 50 so that one bit line 51 is pulled to Vss. This is accomplished by test control circuitry 55 driving one control line 52 to Vdd and its respective data line 53 to Vss. A write operation, which allows for the rapid loading of a test pattern into a row of SRAM cells including SRAM cell 56, includes activating both transistors 8 corresponding to a bit line pair so that one bit line is pulled to Vss and the other bit line is pulled to Vdd. This is accomplished by test control circuitry 55 driving control lines 52 to Vdd and data lines 53 to opposite reference voltage levels.

Although the preferred embodiment of the present invention has been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. A device for loading data in a random access memory device having a memory array of memory cells arranged in rows, and a plurality of bit line pairs, each bit line of said bit line pairs being connected to a column of memory cells within said memory array, said device comprising:

at least one data line;

at least one control line;

a plurality of transistors, each transistor being connected to said data line and to one of said bit line pairs, each transistor having a control element being connected to said control line;

a means for selectively driving said control line to voltage level to turn on said transistors;

a dummy transistor connected to at least one bit line of said bit line pairs for balancing the capacitances between said bit line pairs;

a means for selectively driving said data line to a first voltage level representative of a high logic level and a second voltage level representative of a low logic level, for loading said voltage levels onto said bit lines when said transistors are turned on; and a means for selectively storing said voltage levels into a row of memory cells following loading of said voltage levels onto said bit lines.

2. The device of claim 1, wherein:

said transistors comprise field effect transistors.

3. The device of claim 1, wherein:

each transistor is connected to a bit line pair such that each bit line pair is connected to a single transistor.

4. The device of claim 1, wherein:

each transistor is connected to a single bit line of a single bit line pair.

5. The device of claim 1, wherein:

said random access memory includes sense amplifiers, each said sense amplifier being connected to one of said bit line pairs; and said device includes a means for isolating said sense amplifiers from said bit lines while said control line is driven by said means for driving said control line to turn on said transistors connected thereto.

6. The device of claim 1, wherein:

said random access memory includes sense amplifiers, each said sense amplifier being associated with one of said bit line pairs; and said device includes a means for electrically connecting said sense amplifiers to said respective bit line pairs while said control line is driven by said means for driving said control line so as to turn on said transistors connected to said control line.

7. The device of claim 1, wherein:

each bit line is connected to a single transistor.

8. The device of claim 1, further including:

a compare line to which a bit line of said bit line pairs is connected;

a means for selectively precharging said compare line to a low reference voltage level and a high reference voltage level; and a means for comparing a level appearing on said compare line by said precharging means to stored data retrieved from a row of memory cells.

9. A random access memory device, comprising:

a memory array of memory cells, said memory array being arranged in a plurality of rows of memory cells;

a plurality of bit line pairs, each bit line of said bit line pairs being connected to a column of memory cells of said memory array;

a plurality of sense amplifiers, each said sense amplifier being connected to a bit line pair;

a control line;

a plurality of data lines;

a plurality of transistors, each bit line pair being connected to a single one of said plurality of transistors, each one of said plurality of transistors being connected to one bit line of said bit line pair, and a gate of each one of said plurality of transistors being connected to said control line;

a dummy transistor connected to said at least one bit line of said bit line pairs for balancing the capacitances between bit line pairs;

a circuit for selectively driving said at least one data line to a first voltage representing a first logic level and a second voltage representing a second logic level; and a circuit for selectively driving said control line to turn on said single transistors for electrically connecting said data line to said bit lines.

* * * * *

UNITED STATES PATENT AND TRADEMARK OFFICE
CERTIFICATE OF CORRECTION

| | | |
|---|---|---|
| PATENT NO. | : 6,018,484 | Page 1 of 1 |
| APPLICATION NO. | : 09/183591 | |
| DATED | : January 25, 2000 | |
| INVENTOR(S) | : James Brady | |

It is certified that error appears in the above-identified patent and that said Letters Patent is hereby corrected as shown below:

In the Specification:

At column 2, line number 59, please replace [chiplevel] with -- chip-level --.

At column 2, line number 65, please replace [Embodiment] with -- Embodiments --.

At column 8, line number 18, please add -- 20 -- after the word "circuitry".

At column 9, line number 18, please add -- 20 -- after the word "circuitry".

Signed and Sealed this
Thirteenth Day of March, 2012

David J. Kappos
*Director of the United States Patent and Trademark Office*